(12) United States Patent
Miyoshi et al.

(10) Patent No.: US 6,664,787 B2
(45) Date of Patent: Dec. 16, 2003

(54) METHOD, APPARATUS AND RECORDING MEDIUM FOR MEASURING AND CORRECTING PHASE ERROR IN SPINS IN A PHASE AXIS DIRECTION

(75) Inventors: Mitsuharu Miyoshi, Tokyo (JP); Aki Yamazaki, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 47 days.

(21) Appl. No.: 09/933,423

(22) Filed: Aug. 20, 2001

(65) Prior Publication Data

US 2002/0047708 A1 Apr. 25, 2002

(30) Foreign Application Priority Data

Oct. 20, 2000 (JP) ........................... 2000-320827

(51) Int. Cl.$^7$ ................................................. G01V 3/00
(52) U.S. Cl. ...................................................... 324/307
(58) Field of Search .................................. 324/307, 309

(56) References Cited

U.S. PATENT DOCUMENTS

| | | | | |
|---|---|---|---|---|
| 4,714,884 A | * | 12/1987 | Glover | 324/309 |
| 4,978,918 A | * | 12/1990 | Sakamoto | 324/306 |
| 5,243,285 A | * | 9/1993 | McKinnon et al. | 324/309 |
| 5,281,916 A | * | 1/1994 | Hinks et al. | 324/300 |
| 5,493,224 A | * | 2/1996 | Shiono et al. | 324/307 |
| 5,561,370 A | * | 10/1996 | Fuderer | 324/309 |
| 5,570,019 A | * | 10/1996 | Moonen et al. | 324/309 |
| 5,587,657 A | * | 12/1996 | Kanazawa | 324/307 |
| 5,818,229 A | * | 10/1998 | Kanazawa | 324/307 |
| 5,899,858 A | * | 5/1999 | Muthupillai et al. | 324/307 |
| 6,008,647 A | * | 12/1999 | Zhou et al. | 324/306 |
| 6,011,392 A | * | 1/2000 | Zhou et al. | 324/307 |
| 6,078,176 A | * | 6/2000 | McKinnon | 324/309 |
| 6,127,825 A | * | 10/2000 | Goto | 324/307 |
| 6,218,834 B1 | * | 4/2001 | Goto | 324/307 |
| 6,369,568 B1 | * | 4/2002 | Ma et al. | 324/307 |
| 6,392,411 B1 | * | 5/2002 | Goto | 324/309 |
| 6,470,203 B2 | * | 10/2002 | Miyamoto | 600/410 |
| 6,541,971 B1 | * | 4/2003 | Dannels | 324/309 |

FOREIGN PATENT DOCUMENTS

EP        1 089 087 A2  *  9/2000

* cited by examiner

*Primary Examiner*—Diego Gutierrez
*Assistant Examiner*—Dixomara Vargas
(74) *Attorney, Agent, or Firm*—Moonray Kojima

(57) ABSTRACT

For the purpose of accurately measuring and correcting a phase error in spins in a phase axis direction, a gradient magnetic field having an integral value of zero is applied in the phase axis direction during a time period between first and second 180° excitations to read out a first spin echo SE1; a gradient magnetic field having an integral value of zero is applied in the phase axis direction during a time period between second and third 180° excitations to read out a second spin echo SE2; and a phase error due to an effect of residual magnetization Gp0 is determined based on these spin echoes.

34 Claims, 9 Drawing Sheets

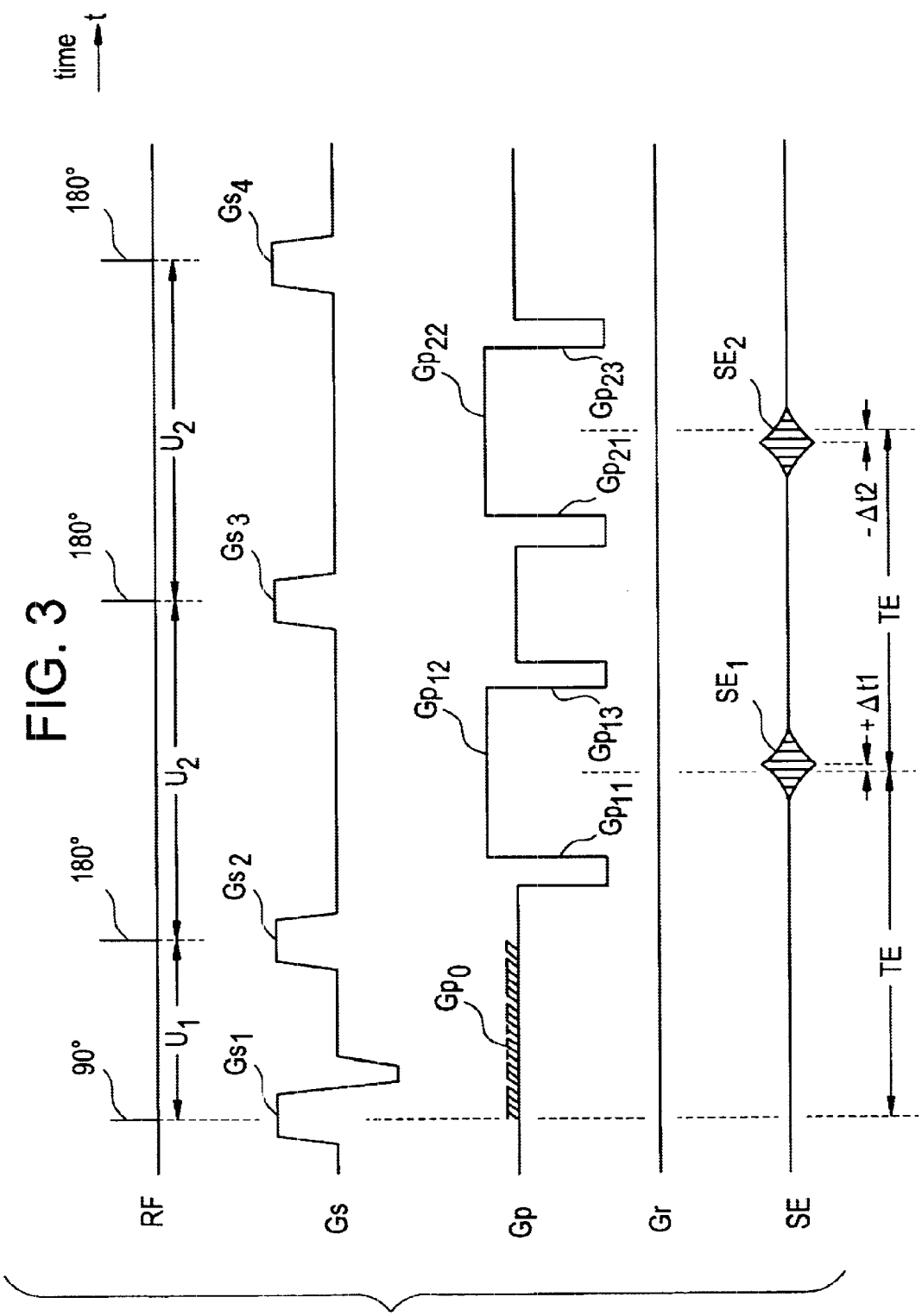

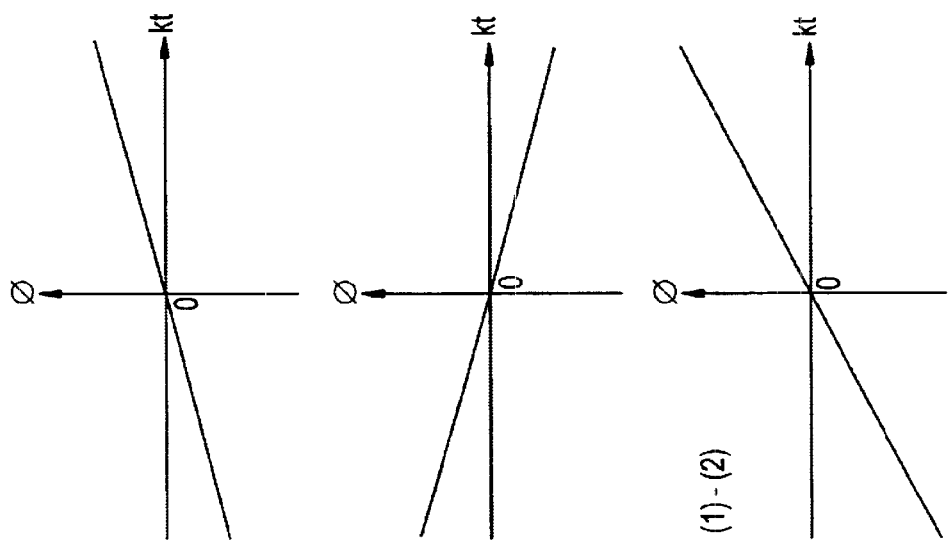
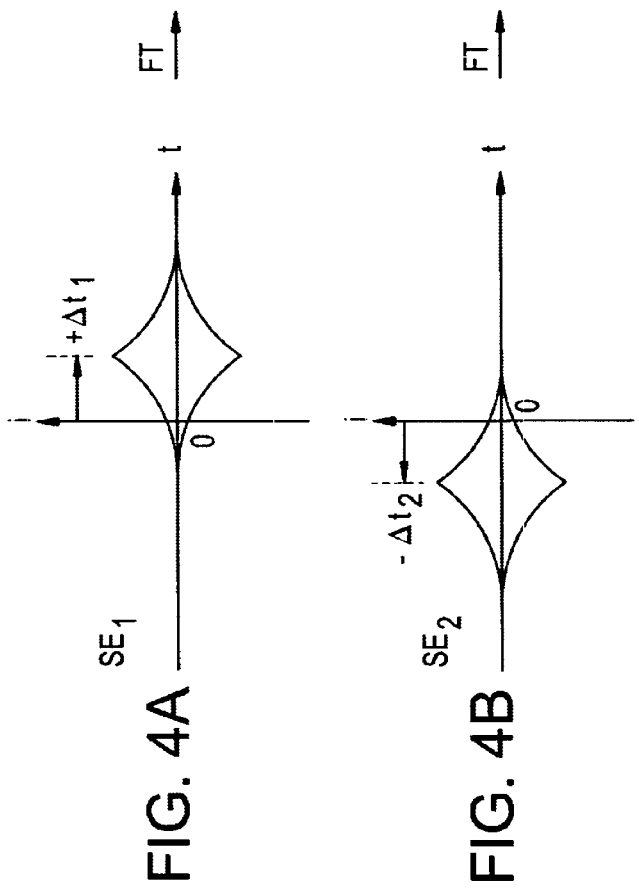
FIG. 4A
FIG. 4B
FIG. 4C

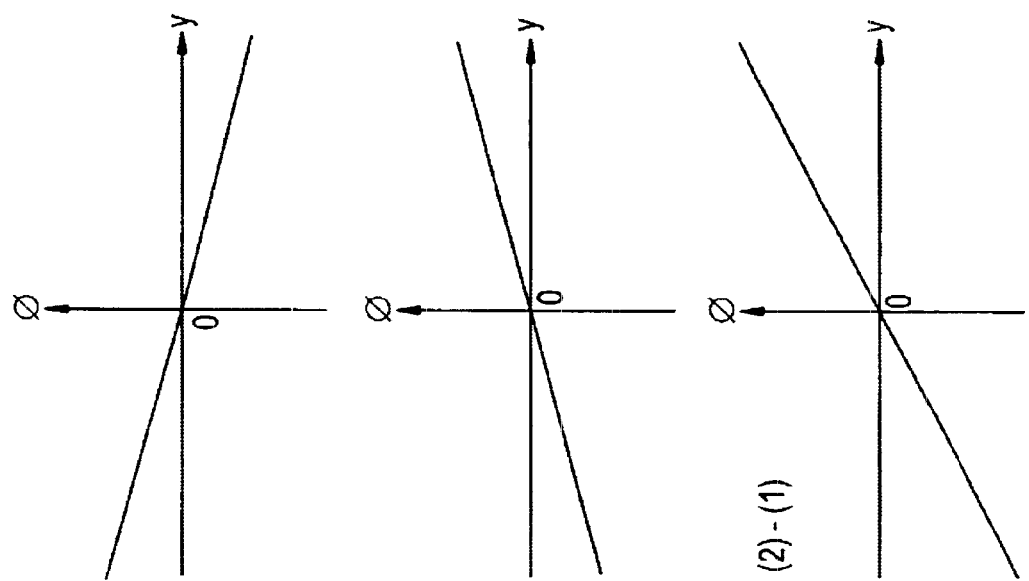
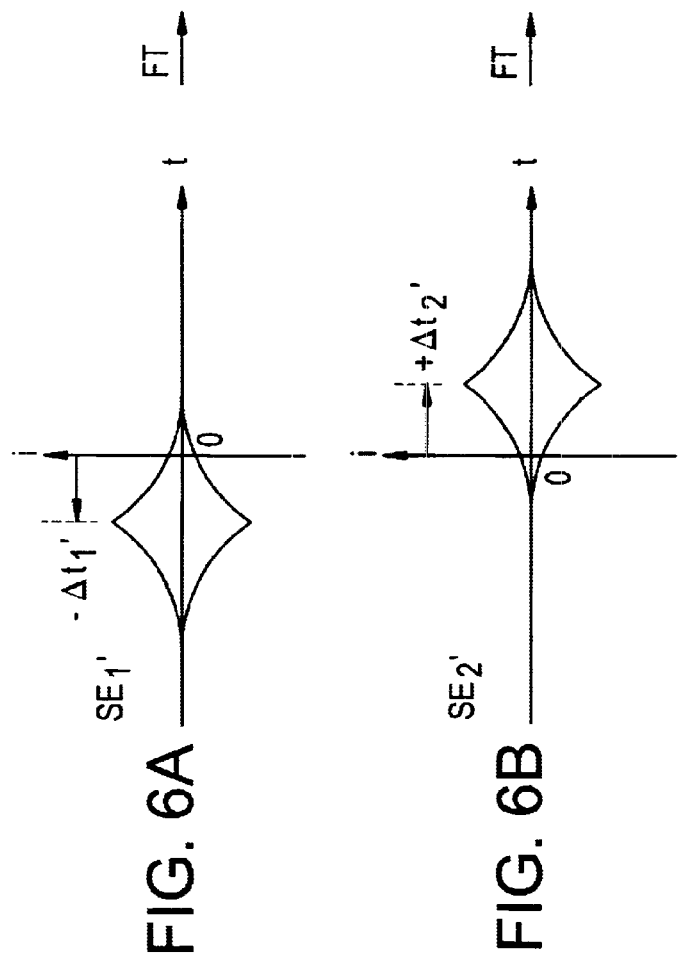
FIG. 6A
FIG. 6B
FIG. 6C

METHOD, APPARATUS AND RECORDING MEDIUM FOR MEASURING AND CORRECTING PHASE ERROR IN SPINS IN A PHASE AXIS DIRECTION

BACKGROUND OF THE INVENTION

The present invention relates to a phase error measuring method and apparatus, phase error correcting method and apparatus, recording medium and magnetic resonance imaging apparatus, and more particularly to a method and apparatus for measuring a phase error in spins due to the effect of residual magnetization etc., a method and apparatus for correcting such a phase error, a recording medium recorded with a program for operating a computer to perform a phase error measuring function, a recording medium recorded with a program for operating a computer to perform a phase error correcting function, a magnetic resonance imaging apparatus comprising phase error measuring means, and a magnetic resonance imaging apparatus comprising phase error correcting means.

In a magnetic resonance imaging (MRI) apparatus, an object to be imaged is carried into an internal space of a magnet system, i.e., a space in which a static magnetic field is generated; gradient magnetic fields and a high frequency magnetic field are applied to generate magnetic resonance signals from spins within the object; and a tomographic image is reconstructed based on the received signals.

The gradient magnetic fields are applied in three mutually perpendicular axis directions. The three mutually perpendicular axes are slice, phase and frequency axes. The gradient magnetic field in the slice axis direction serves to selectively excite a desired slice on the slice axis by an RF (radio frequency) excitation signal, and is sometimes referred to as a slice gradient. The gradient magnetic field in the phase axis direction serves for phase encoding of the spins, and is sometimes referred to as a phase encoding gradient. The gradient magnetic field in the frequency axis direction serves for readout of the magnetic resonance signal, and is sometimes referred to as a readout gradient. The magnetic resonance signal is read out as an echo signal.

One magnetic resonance imaging method is the fast spin echo (FSE) technique. This technique involves exciting spins by 90°, followed by repeating inversion of the spins by a 180° excitation a plurality of times to acquire spin echoes for a plurality views for each 90° excitation.

A pulse sequence of the FSE technique is shown in FIG. 1. In FIG. 1, (1) is a sequence of 90° and 180° excitations; (2), (3) and (4) are sequences of slice gradients Gs, phase encoding gradients Gp and readout gradients Gr, respectively; and (5) is a sequence of spin echoes SE. These sequences proceed along a time axis t.

As shown, a 90° excitation is effected while applying a slice gradient Gs1. Next, after a time period U1, a first 180° excitation is effected while applying a slice gradient Gs2. Next, after a time period U2, a second 180° excitation is effected while applying a slice gradient Gs3. Thereafter, third, fourth, . . . 180° excitations are effected while applying respective slice gradients Gs4, Gs5, . . . at every time period U2 in a similar manner.

During the time period from the 90° excitation to the first 180° excitation, a readout gradient Gr1 is applied to perform phase dispersion, or dephasing, of the spins. Next, during the time period from the first 180° excitation to the second 180° excitation, a readout gradient Gr2 is applied to perform phase focusing, or rephasing, of the spins and generate a first spin echo SE1. The readout gradient Gr2, which generated the spin echo, dephases the spins in its latter half portion.

Prior to the application of the readout gradient Gr2, a phase encoding gradient Gp1 is applied to perform phase encoding, and after the application of the readout gradient Gr2 is completed, a phase encoding gradient Gp1' is applied in the opposite direction to cancel the phase encoding.

Thereafter, readout gradients Gr3, Gr4, . . . are applied during every time period between the 180° excitations to generate respective spin echoes SE2, SE3, . . . in a similar manner. Moreover, phase encoding is achieved by phase encoding gradients Gp2, Gp3 . . . The phase encoding is differentiated every time.

The spin echo is an RF signal having maximum amplitude at the center of the echo. The maximum amplitude, or a peak, of the first spin echo SE1 occurs after a time period TE (echo time) from the 90° excitation. A peak of the second spin echo SE2 occurs after the time period TE from the peak of the first spin echo SE1. Thereafter, peaks of the spin echoes SE3, SE4, . . . occur at intervals of time period TE in a similar manner. The generation of a peak is sometimes referred to as focalization (image formation) of a spin echo.

In a magnet system that achieves static magnetic field generation by permanent magnets, residual magnetization may occur owing to, for example, magnetization of pole pieces of the permanent magnets by the gradient magnetic fields. Since the residual magnetization in the frequency axis direction affects the dephasing of the spins during the time period between the 90° and 180° excitations, timing of the spin echo focalization, or timing of the peak generation, experiences an error. A similar phenomenon is produced by eddy currents.

For example, if the first spin echo SE1 focalizes in a time period TE' shorter than proper TE, the second spin echo SE2 focalizes in a time period TE" longer than proper TE, and the third spin echo SE3 focalizes at timing TE' shorter than proper TE, due to the timing error in the focalization. Thereafter, the spin echo SEi (i: 4, 5, 6 . . . ) focalizes at timing such that a time period longer than proper TE and a time period shorter than proper TE alternate.

Since such a focalization error is a source of artifact generation in a reconstructed image, an attempt has been made to cancel the effect of the resident magnetization, eddy current etc. in the frequency axis direction by adjusting the readout gradient to correct the focalization error.

When residual magnetization exists also in the phase axis direction, a focalization error occurs due to the effect of the residual magnetization. The focalization error, however, cannot be corrected by adjusting the readout gradient because the axis of the gradient is different. Moreover, in the first place, the effect of the residual magnetization etc. in the phase axis direction on the phase of spins cannot be accurately measured.

SUMMARY OF THE INVENTION

It is therefore an object of the present invention to provide method and apparatus for accurately measuring a phase error in spins in the phase axis direction, method and apparatus for correcting such a phase error, a recording medium recorded with a program for operating a computer to perform a phase error measuring function, a recording medium recorded with a program to operate a computer to perform a phase error correcting function, a magnetic resonance imaging apparatus comprising phase error measuring means, and a magnetic resonance imaging apparatus comprising phase error correcting means.

(1) The present invention, in accordance with one aspect for solving the aforementioned problem, is a phase error measuring method characterized in comprising: effecting a 90° excitation on object spins; effecting a first 180° excitation after a first time period from said 90° excitation; effecting a second 180° excitation after a second time period from said first 180° excitation; effecting a third 180° excitation after said second time period from said second 180° excitation; applying a gradient magnetic field having a time integral value of zero in a phase axis direction during the time period from said first 180° excitation to said second 180° excitation to read out a first spin echo signal; applying a gradient magnetic field having a time integral value of zero in the phase axis direction during the time period from said second 180° excitation to said third 180° excitation to read out a second spin echo signal; and determining a phase error of the spins in the phase axis direction during the time period from said 90° excitation to said first 180° excitation based on said first and second spin echo signals.

(2) The present invention, in accordance with another aspect for solving the aforementioned problem, is a phase error measuring apparatus characterized in comprising: spin exciting means for effecting a 90° excitation on object spins, effecting a first 180° excitation after a first time period from said 90° excitation, effecting a second 180° excitation after a second time period from said first 180° excitation, and effecting a third 180° excitation after said second time period from said second 180° excitation; echo readout means for applying a gradient magnetic field having a time integral value of zero in a phase axis direction during the time period from said first 180° excitation to said second 180° excitation to read out a first spin echo signal, and applying a gradient magnetic field having a time integral value of zero in the phase axis direction during the time period from said second 180° excitation to said third 180° excitation to read out a second spin echo signal; and phase error calculating means for determining a phase error of the spins in the phase axis direction during the time period from said 90° excitation to said first 180° excitation based on said first and second spin echo signals.

(3) The present invention, in accordance with still another aspect for solving the aforementioned problem, is a recording medium characterized in being recorded in a computer-readable manner with a program for causing a computer to execute the functions of: effecting a 90° excitation on object spins; effecting a first 180° excitation after a first time period from said 90° excitation; effecting a second 180° excitation after a second time period from said first 180° excitation; effecting a third 180° excitation after said second time period from said second 180° excitation; applying a gradient magnetic field having a time integral value of zero in a phase axis direction during the time period from said first 180° excitation to said second 180° excitation to read out a first spin echo signal; applying a gradient magnetic field having a time integral value of zero in the phase axis direction during the time period from said second 180° excitation to said third 180° excitation to read out a second spin echo signal; and determining a phase error of the spins in the phase axis direction during the time period from said 90° excitation to said first 180° excitation based on said first and second spin echo signals.

(4) The present invention, in accordance with still another aspect for solving the aforementioned problem, is a magnetic resonance imaging apparatus for acquiring a magnetic resonance signal from an object using a static magnetic field, gradient magnetic fields and a high frequency magnetic field, and constructing an image based on said acquired magnetic resonance signal, characterized in comprising: spin exciting means for effecting a 90° excitation on object spins, effecting a first 180° excitation after a first time period from said 90° excitation, effecting a second 180° excitation after a second time period from said first 180° excitation, and effecting a third 180° excitation after said second time period from said second 180° excitation; echo readout means for applying a gradient magnetic field having a time integral value of zero in a phase axis direction during the time period from said first 180° excitation to said second 180° excitation to read out a first spin echo signal, and applying a gradient magnetic field having a time integral value of zero in the phase axis direction during the time period from said second 180° excitation to said third 180° excitation to read out a second spin echo signal; and phase error calculating means for determining a phase error of the spins in the phase axis direction during the time period from said 90° excitation to said first 180° excitation based on said first and second spin echo signals.

According to the invention in the aspects as described regarding (1)–(4), since no gradient magnetic field is applied in the phase axis direction during the time period between 90° and 180° excitations, and gradient magnetic fields having respective time integral values of zero are applied in the phase axis direction during the periods between 180° excitations to read out respective spin echo signals, two spin echo signals can be obtained which are affected inversely with respect to each other by residual magnetization etc. in the phase axis direction during the time period between the 90° and 180° excitations. Thus, a phase error of spins can be determined from these spin echo signals via a calculation.

In the invention in the aspects as described regarding (1)–(4), by applying crusher gradient magnetic fields in the frequency axis direction before and after each 180° excitation, interference by an FID signal can be eliminated and generation of a stimulated echo can also be inhibited to improve the accuracy of measurement.

(5) The present invention, in accordance with still another aspect for solving the aforementioned problem, is a phase error measuring method characterized in comprising: effecting a 90° excitation on object spins; effecting a first 180° excitation after a first time period from said 90° excitation; effecting a second 180° excitation after a second time period from said first 180° excitation; effecting a third 180° excitation after said second time period from said second 180° excitation; applying a gradient magnetic field having a time integral value of zero in a phase axis direction during the time period from said first 180° excitation to said second 180° excitation to read out a first spin echo signal; applying a gradient magnetic field having a integral value of zero in the phase axis direction during the time period from said second 180° excitation to said third 180° excitation to read out a second spin echo signal; determining a phase error of the spins in the phase axis direction during the time period from said 90° excitation to said first 180° excitation based on said first and second spin echo signals; repeating said steps twice on trial with the polarity of said gradient magnetic fields inverted; and determining the average of the former and latter determined phase errors.

(6) The present invention, in accordance with still another aspect for solving the aforementioned problem, is a phase error measuring apparatus characterized in comprising: spin exciting means for effecting a 90° excitation on object spins, effecting a first 180° excitation after a first time period from said 90° excitation, effecting a second 180° excitation after a second time period from said first 180° excitation, and effecting a third 180° excitation after said second time period from said second 180° excitation; echo readout means for applying a gradient magnetic field having a time integral value of zero in a phase axis direction during the time period from said first 180° excitation to said second 180° excitation to read out a first spin echo signal, and applying a gradient magnetic field having a time integral value of zero in the phase axis direction during the time period from said second 180° excitation to said third 180° excitation to read out a second spin echo signal; phase error calculating means for determining a phase error of the spins in the phase axis direction during the time period from said 90° excitation to said first 180° excitation based on said first and second spin echo signals; control means for repeating the spin excitations by said spin exciting means, the spin echo readout by said echo readout means, and the phase error calculation by said phase error calculating means twice on trial with the polarity of said gradient magnetic fields inverted; and average calculating means for determining the average of the former and latter determined phase errors.

(7) The present invention, in accordance with still another aspect for solving the aforementioned problem, is a recording medium characterized in being recorded in a computer-readable manner with a program for causing a computer to execute the functions of: effecting a 90° excitation on object spins; effecting a first 180° excitation after a first time period from said 90° excitation; effecting a second 180° excitation after a second time period from said first 180° excitation; effecting a third 180° excitation after said second time period from said second 180° excitation; applying a gradient magnetic field having a time integral value of zero in a phase axis direction during the time period from said first 180° excitation to said second 180° excitation to read out a first spin echo signal; applying a gradient magnetic field having a time integral value of zero in the phase axis direction during the time period from said second 180° excitation to said third 180° excitation to read out a second spin echo signal; determining a phase error of the spins in the phase axis direction during the time period from said 90° excitation to said first 180° excitation based on said first and second spin echo signals; repeating said steps twice on trial with the polarity of said gradient magnetic fields inverted; and determining the average of the former and latter determined phase errors.

(8) The present invention, in accordance with still another aspect for solving the aforementioned problem, is a magnetic resonance imaging apparatus for acquiring a magnetic resonance signal from an object using a static magnetic field, gradient magnetic fields and a high frequency magnetic field, and constructing an image based on said acquired magnetic resonance signal, characterized in comprising: spin exciting means for effecting a 90° excitation on object spins, effecting a first 180° excitation after a first time period from said 90° excitation, effecting a second 180° excitation after a second time period from said first 180° excitation, and effecting a third 180° excitation after said second time period from said second 180° excitation; echo readout means for applying a gradient magnetic field having a time integral value of zero in a phase axis direction during the time period from said first 180° excitation to said second 180° excitation to read out a first spin echo signal, and applying a gradient magnetic field having a time integral value of zero in the phase axis direction during the time period from said second 180° excitation to said third 180° excitation to read out a second spin echo signal; phase error calculating means for determining a phase error of the spins in the phase axis direction during the time period from said 90° excitation to said first 180° excitation based on said first and second spin echo signals; control means for repeating the spin excitations by said spin exciting means, the spin echo readout by said echo readout means, and the phase error calculation by said phase error calculating means twice on trial with the polarity of said gradient magnetic fields inverted; and average calculating means for determining the average of the former and latter determined phase errors.

According to the invention in the aspects as described regarding (5)–(8), since no gradient magnetic field is applied in the phase axis direction during the time period between 90° and 180° excitations, and gradient magnetic fields having respective time integral values of zero are applied in the phase axis direction during the periods between 180° excitations to read out respective spin echo signals, two spin echo signals can be obtained which are affected inversely with respect to each other by residual magnetization etc. in the phase axis direction during the time period between the 90° and 180° excitations. Thus, a phase error of spins can be determined from these spin echo signals via a calculation.

By repeating such a phase error measurement twice on trial with the polarity of the gradient magnetic fields inverted, and averaging the resulting measured values, the effect of the gradient magnetic field applied during each time period between 180° excitations on the measured value can be canceled, and measured values can be obtained with high accuracy.

In the invention in the aspects as described regarding (5)–(8), by applying crusher gradient magnetic fields in the frequency axis direction before and after each 180° excitation, interference by an FID signal can be eliminated and generation of a stimulated echo can also be inhibited to further improve the accuracy of measurement.

In this case, by applying the crusher gradient magnetic fields with their polarity inverted in the two trials, the effect of the gradient magnetic fields applied as the crusher on the measured value can be canceled, thereby allowing measurement to be performed with higher accuracy.

(9) The present invention, in accordance with still another aspect for solving the aforementioned problem, is a phase error correcting method characterized in comprising: effecting a 90° excitation on object spins; effecting a first 180° excitation after a first time period from said 90° excitation; effecting a second 180° excitation after a second time period from said first 180° excitation; effecting a third 180° excitation after said second time period from said second 180° excitation; applying a gradient magnetic field having a time integral value of zero in a phase axis direction during the time period from said first 180° excitation to said second 180° excitation to read out a first spin echo signal; applying a gradient magnetic field having a time integral value of zero in the phase axis direction during the time period from said second 180° excitation to said third 180° excitation to read out a second spin echo signal; determining a phase error of the spins in the phase axis direction during the time period from said 90° excitation to said first 180° excitation based on said first and second spin echo signals; and applying a gradient magnetic field that makes said phase error zero in the phase axis direction during a time period from a 90° excitation to a 180° excitation.

(10) The present invention, in accordance with still another aspect for solving the aforementioned problem, is a phase error correcting apparatus characterized in comprising: spin exciting means for effecting a 90° excitation on object spins, effecting a first 180° excitation after a first time period from said 90° excitation, effecting a second 180° excitation after a second time period from said first 180° excitation, and effecting a third 180° excitation after said second time period from said second 180° excitation; echo readout means for applying a gradient magnetic field having a time integral value of zero in a phase axis direction during the time period from said first 180° excitation to said second 180° excitation to read out a first spin echo signal, and applying a gradient magnetic field having a time integral value of zero in the phase axis direction during the time period from said second 180° excitation to said third 180° excitation to read out a second spin echo signal; phase error calculating means for determining a phase error of the spins in the phase axis direction during the time period from said 90° excitation to said first 180° excitation based on said first and second spin echo signals; and corrective gradient magnetic field applying means for applying a gradient magnetic field that makes said phase error zero in the phase axis direction during a time period from a 90° excitation to a 180° excitation.

(11) The present invention, in accordance with still another aspect for solving the aforementioned problem, is a recording medium characterized in being recorded in a computer-readable manner with a program for causing a computer to execute the functions of: effecting a 90° excitation on object spins; effecting a first 180° excitation after a first time period from said 90° excitation; effecting a second 180° excitation after a second time period from said first 180° excitation; effecting a third 180° excitation after said second time period from said second 180° excitation; applying a gradient magnetic field having a time integral value of zero in a phase axis direction during the time period from said first 180° excitation to said second 180° excitation to read out a first spin echo signal; applying a gradient magnetic field having a time integral value of zero in the phase axis direction during the time period from said second 180° excitation to said third 180° excitation to read out a second spin echo signal; determining a phase error of the spins in the phase axis direction during the time period from said 90° excitation to said first 180° excitation based on said first and second spin echo signals; and applying a gradient magnetic field that makes said phase error zero in the phase axis direction during a time period from a 90° excitation to a 180° excitation.

(12) The present invention, in accordance with still another aspect for solving the aforementioned problem, is a magnetic resonance imaging apparatus for acquiring a magnetic resonance signal from an object using a static magnetic field, gradient magnetic fields and a high frequency magnetic field, and constructing an image based on said acquired magnetic resonance signal, characterized in comprising: spin exciting means for effecting a 90° excitation on object spins, effecting a first 180° excitation after a first time period from said 90° excitation, effecting a second 180° excitation after a second time period from said first 180° excitation, and effecting a third 180° excitation after said second time period from said second 180° excitation; echo readout means for applying a gradient magnetic field having a time integral value of zero in a phase axis direction during the time period from said first 180° excitation to said second 180° excitation to read out a first spin echo signal, and applying a gradient magnetic field having a time integral value of zero in the phase axis direction during the time period from said second 180° excitation to said third 180° excitation to read out a second spin echo signal; phase error calculating means for determining a phase error of the spins in the phase axis direction during the time period from said 90° excitation to said first 180° excitation based on said first and second spin echo signals; and corrective gradient magnetic field applying means for applying a gradient magnetic field that makes said phase error zero in the phase axis direction during a time period from a 90° excitation to a 180° excitation.

According to the invention in the aspects as described regarding (9)–(12), since a phase error is measured similarly to the invention in the aspects of (1)–(4), and a gradient magnetic field that makes the phase error zero is applied in the phase axis direction during a time period from a 90° excitation to a first 180° excitation, a phase error due to a residual gradient magnetic field in the phase axis direction can be corrected.

(13) The present invention, in accordance with still another aspect for solving the aforementioned problem, is a phase error correcting method characterized in comprising: effecting a 90° excitation on object spins; effecting a first 180° excitation after a first time period from said 90° excitation; effecting a second 180° excitation after a second time period from said first 180° excitation; effecting a third 180° excitation after said second time period from said second 180° excitation; applying a gradient magnetic field having a time integral value of zero in a phase axis direction during the time period from said first 180° excitation to said second 180° excitation to read out a first spin echo signal; applying a gradient magnetic field having a time integral value of zero in the phase axis direction during the time period from said second 180° excitation to said third 180° excitation to read out a second spin echo signal; determining a phase error of the spins in the phase axis direction during the time period from said 90° excitation to said first 180° excitation based on said first and second spin echo signals; repeating said steps twice on trial with the polarity of said gradient magnetic fields inverted; determining the average of the former and latter determined phase errors; and applying a gradient magnetic field that makes the average of said phase errors zero in the phase axis direction during a time period from a 90° excitation to a 180° excitation.

(14) The present invention, in accordance with still another aspect for solving the aforementioned problem, is a phase error correcting apparatus characterized in comprising: spin exciting means for effecting a 90° excitation on object spins, effecting a first 180° excitation after a first time period from said 90° excitation, effecting a second 180° excitation after a second time period from said first 180° excitation, and effecting a third 180° excitation after said second time period from said second 180° excitation; echo readout means for applying a gradient magnetic field having a time integral value of zero in a phase axis direction during the time period from said first 180° excitation to said second 180° excitation to read out a first spin echo signal, and applying a gradient magnetic field having a time integral value of zero in the phase axis direction during the time period from said second 180° excitation to said third 180° excitation to read out a second spin echo signal; phase error calculating means for determining a phase error of the spins in the phase axis direction during the time period from said 90° excitation to said first 180° excitation based on said first and second spin echo signals; control means for repeating the spin excitations by said spin exciting means, the spin echo readout by said echo readout means, and the phase error calculation by said phase error calculating means twice on trial with the polarity of said gradient magnetic fields inverted; average calculating means for determining the average of the former and latter determined phase errors; and corrective gradient magnetic field applying means for applying a gradient magnetic field that makes the average of said phase errors zero in the phase axis direction during a time period from a 90° excitation to a 180° excitation.

(15) The present invention, in accordance with still another aspect for solving the aforementioned problem, is a recording medium characterized in being recorded in a computer-readable manner with a program for causing a computer to execute the functions of: effecting a 90° excitation on object spins; effecting a first 180° excitation after a first time period from said 90° excitation; effecting a second 180° excitation after a second time period from said first 180° excitation; effecting a third 180° excitation after said second time period from said second 180° excitation; applying a gradient magnetic field having a time integral value of zero in a phase axis direction during the time period from said first 180° excitation to said second 180° excitation to read out a first spin echo signal; applying a gradient magnetic field having a time integral value of zero in the phase axis direction during the time period from said second 180° excitation to said third 180° excitation to read out a second spin echo signal; determining a phase error of the spins in the phase axis direction during the time period from said 90° excitation to said first 180° excitation based on said first and second spin echo signals; repeating said steps twice on trial with the polarity of said gradient magnetic fields inverted; determining the average of the former and latter determined phase errors; and applying a gradient magnetic field that makes the average of said phase errors zero in the phase axis direction during a time period from a 90° excitation to a 180° excitation.

(16) The present invention, in accordance with still another aspect for solving the aforementioned problem, is a magnetic resonance imaging apparatus for acquiring a magnetic resonance signal from an object using a static magnetic field, gradient magnetic fields and a high frequency magnetic field, and constructing an image based on said acquired magnetic resonance signal, characterized in comprising: spin exciting means for effecting a 90° excitation on object spins, effecting a first 180° excitation after a first time period from said 90° excitation, effecting a second 180° excitation after a second time period from said first 180° excitation, and effecting a third 180° excitation after said second time period from said second 180° excitation; echo readout means for applying a gradient magnetic field having a time integral value of zero in a phase axis direction during the time period from said first 180° excitation to said second 180° excitation to read out a first spin echo signal, and applying a gradient magnetic field having a time integral value of zero in the phase axis direction during the time period from said second 180° excitation to said third 180° excitation to read out a second spin echo signal; phase error calculating means for determining a phase error of the spins in the phase axis direction during the time period from said 90° excitation to said first 180° excitation based on said first and second spin echo signals; control means for repeating the spin excitations by said spin exciting means, the spin echo readout by said echo readout means, and the phase error calculation by said phase error calculating means twice on trial with the polarity of said gradient magnetic fields inverted; average calculating means for determining the average of the former and latter determined phase errors; and corrective gradient magnetic field applying means for applying a gradient magnetic field that makes the average of said phase errors zero in the phase axis direction during a time period from a 90° excitation to a 180° excitation.

According to the invention in the aspects as described regarding (13)–(16), since a phase error is measured similarly to the invention in the aspects of (5)–(8), and a gradient magnetic field that makes the phase error zero is applied in the phase axis direction during a time period from a 90° excitation to a first 180° excitation, a phase error due to a residual gradient magnetic field in the phase axis direction can be more accurately corrected.

Therefore, the present invention can provide a method and apparatus for accurately measuring a phase error in spins in a phase axis direction, a method and apparatus for correcting such a phase error, a recording medium recorded with a program for operating a computer to perform a phase error measuring function, a recording medium recorded with a program for operating a computer to perform a phase error correcting function, a magnetic resonance imaging apparatus comprising phase error measuring means, and a magnetic resonance imaging apparatus comprising phase error correcting means.

Further objects and advantages of the present invention will be apparent from the following description of the preferred embodiments of the invention as illustrated in the accompanying drawings.

BRIEF DESCRIPTION OF THE DRAWINGS

FIG. 3 is a diagram illustrating an exemplary pulse sequence for phase error measurement.

FIG. 4 is a conceptional diagram of phase error calculation.

FIG. 6 is a conceptional diagram of phase error calculation.

DETAILED DESCRIPTION OF THE INVENTION

Figure 2:
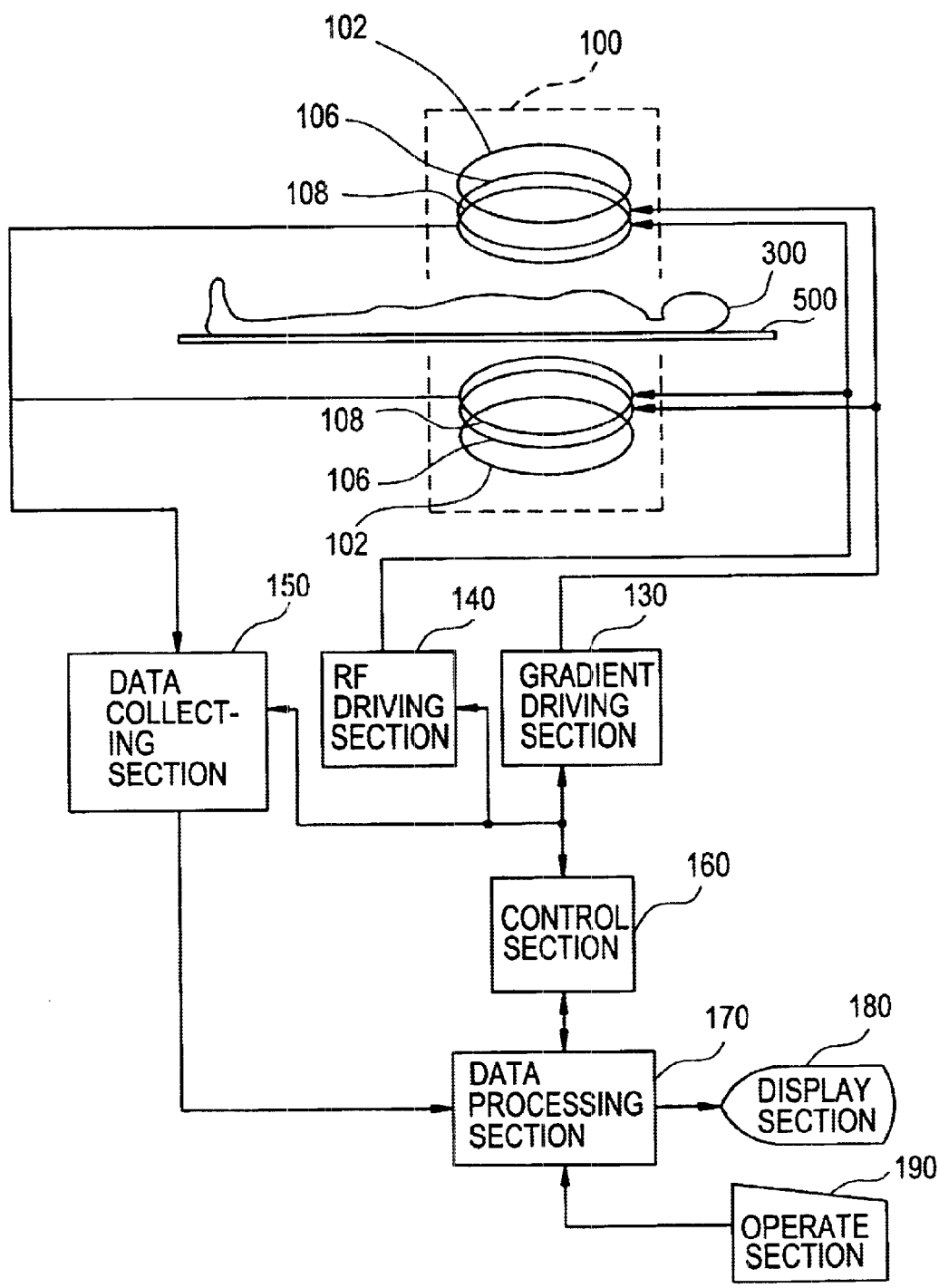
FIG. 2 is a block diagram of an apparatus in accordance with an embodiment of the present invention.

Several embodiments of the present invention will now be described in detail with reference to the accompanying drawings. FIG. 2 illustrates a block diagram of a magnetic resonance imaging apparatus, which is an embodiment of the present invention. The configuration of the apparatus represents an embodiment of the apparatus in accordance with the present invention. The operation of the apparatus represents an embodiment of the method in accordance with the present invention.

As shown in FIG. 2, the present apparatus has a magnet system 100. The magnet system 100 has a main magnetic field magnet section 102, a gradient coil section 106 and an RF coil section 108. The main magnetic field magnet section 102 and the coil sections each comprise a pair of members facing each other across a space. These sections have a generally disk-like shape and are disposed to have a common center axis. An object 300 is rested on a cradle 500 and carried into and out of the internal space (bore) of the magnet system 100 by carrier means, which is not shown.

The main magnetic field magnet section 102 generates a static magnetic field in the internal space of the magnet system 100. The direction of the static magnetic field is generally orthogonal to the direction of the body axis of the object 300. That is, a "vertical" magnetic field is generated. The main magnetic field magnet section 102 is constructed using a permanent magnet, for example.

The gradient coil section 106 generates three gradient magnetic fields for imparting respective gradients to the static magnetic field strength in directions of three mutually perpendicular axes, i.e., slice axis, phase axis and frequency axis.

When mutually perpendicular coordinate axes in the static magnetic field space are represented as x, y and z, any one of the axes can be the slice axis. In this case, one of the two remaining axes is the phase axis and the other is the frequency axis. Moreover, the slice, phase and frequency axes can be given arbitrary inclination with respect to the x-, y- and z-axes while maintaining their mutual perpendicularity.

The gradient magnetic field in the slice axis direction is referred to as the slice gradient magnetic field. The gradient magnetic field in the phase axis direction is referred to as the phase encoding gradient magnetic field. The gradient magnetic field in the frequency axis direction is referred to as the readout gradient magnetic field. In order to enable generation of such gradient magnetic fields, the gradient coil section 106 has three gradient coils, which are not shown. The gradient magnetic field will be sometimes referred to simply as a gradient hereinbelow.

The RF coil section 108 transmits an RF excitation signal for exciting spins within the object 300 in the static magnetic field space. The RF coil section 108 also receives a magnetic resonance signal generated by the excited spins.

The RF coil section 108 has transmission and receive coils, which are not shown. For the transmission and receive coils, the same coil or separate dedicated coils may be used.

The gradient coil section 106 is connected with a gradient driving section 130. The gradient driving section 130 supplies driving signals to the gradient coil section 106 to generate the gradient magnetic fields. The gradient driving section 130 has three driving circuits, which are not shown, corresponding to the three gradient coils in the gradient coil section 106.

The RF coil section 108 is connected with an RF driving section 140. The RF driving section 140 supplies driving signals to the RF coil section 108 to transmit the RF excitation signal, thereby exciting the spins within the object 300.

The RF coil section 108 is connected to a data collecting section 150. The data collecting section 150 gathers receive signals received by the RF coil section 108 by sampling them, and collects the signals as digital data.

The gradient driving section 130, RF driving section 140 and data collecting section 150 are connected with a control section 160. The control section 160 controls the gradient driving section 130, RF driving section 140 and data collecting section 150 to carry out imaging.

The control section 160 is constructed using, for example, a computer. The control section 160 has a memory, which is not shown. The memory stores programs for the control section 160 and several kinds of data. The function of the control section 160 is achieved by the computer executing a program stored in the memory.

The output of the data collecting section 150 is connected to a data processing section 170. The data collected by the data collecting section 150 is input to the data processing section 170. The data processing section 170 is constructed using, for example, a computer. The data processing section 170 has a memory, which is not shown. The memory stores programs for the data processing section 170 and several kinds of data.

The data processing section 170 is connected with the control section 160. The data processing section 170 is above the control section 160 and controls it. The function of the present apparatus is achieved by the data processing section 170 executing a program stored in the memory.

The data processing section 170 stores data collected by the data collecting section 150 into the memory. A data space is formed in the memory. The data space constitutes a two-dimensional Fourier space. The Fourier space will be sometimes referred to as a k-space hereinbelow. The data processing section 170 performs a two-dimensional inverse Fourier transformation on the data in the k-space to reconstruct an image of the object 300.

The data processing section 170 is connected with a display section 180 and an operating section 190. The display section 180 comprises a graphic display, etc. The operating section 190 comprises a keyboard, etc., provided with a pointing device.

The display section 180 displays the reconstructed image and several kinds of information output from the data processing section 170. The operating section 190 is operated by a user, and the section 190 inputs several commands, information and so forth to the data processing section 170. The user interactively operates the present apparatus via the display section 180 and operating section 190.

Using such configuration of the present apparatus, measurement and correction of a phase error due to residual magnetization in the phase axis direction is performed. A portion consisting of the magnet system 100, gradient driving section 130, RF driving section 140, data collecting section 150, control section 160 and data processing section 170 is an embodiment of the phase error measuring apparatus of the present invention. The portion is also an embodiment of the phase error correcting apparatus of the present invention. The configuration of the apparatus represents an embodiment of the apparatus in accordance with the present invention. The operation of the apparatus represents an embodiment of the method in accordance with the present invention.

An exemplary pulse sequence executed by the present apparatus for measuring the phase error is shown in FIG. 3. In FIG. 3, (1) is a sequence of RF excitations; (2) is a sequence of slice gradients Gs; (3) is a sequence of gradients Gp in the phase axis direction; (4) is a sequence of gradients Gr in the frequency axis direction; and (5) is a sequence of spin echoes SE. These sequences proceed along a time axis t.

Figure 1:
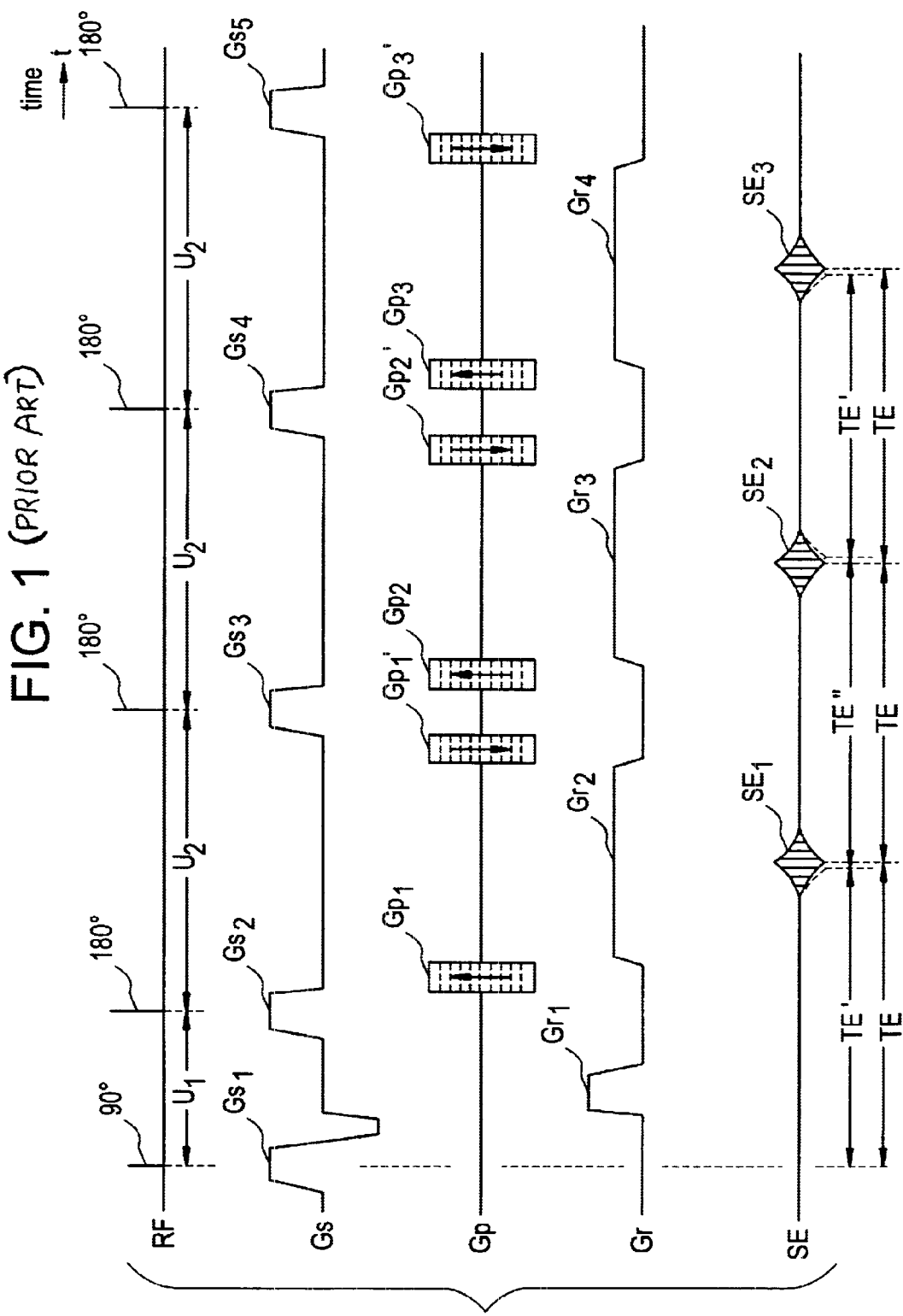
FIG. 1 is a diagram illustrating a pulse sequence of an FSE technique.

The sequences for selective excitation shown at (1) and (2) are the same as those shown in FIG. 1. A portion consisting of the magnet system 100, gradient driving section 130 and RF driving section 140 involved in the execution of the sequences is an embodiment of the spin exciting means of the present invention.

As shown at (3), gradients Gp11, Gp12 and Gp13, whose polarity alternates twice, are applied in the phase axis direction during a time period between the first and second 180° excitations, and gradients Gp21, Gp22 and Gp23, whose polarity alternates twice, are applied during a time period between the second and third 180° excitations. No gradient is applied during a period between the 90° excitation and the first 180° excitation. Moreover, no gradient is applied in the frequency axis direction in this example, as shown at (4).

During the time period between the first and second 180° excitations, the gradient Gp11 of negative polarity is first applied; next, the polarity is switched and the gradient Gp12 of positive polarity is applied; and then, the polarity is switched again and the gradient Gp13 of negative polarity is applied.

Also during the time period between the second and third 180° excitations, the gradient Gp21 of negative polarity is first applied; next, the polarity is switched and the gradient Gp22 of positive polarity is applied; and then, the polarity is switched again and the gradient Gp23 of negative polarity is applied.

By such gradients, dephasing and rephasing of spins are alternately effected in the phase axis direction. Specifically, dephasing is effected by the gradient Gp11, rephasing is effected by the gradient Gp12, and dephasing is effected by the gradient Gp13. Similarly, dephasing, rephasing and dephasing are effected by the gradients Gp21, Gp22 and Gp23, respectively.

The gradients Gp11, Gp12 and Gp13 are each designed to have a time integral value of zero over the entire gradients. Specifically, the time integral value of the first half of the gradient Gp12 is equal to the time integral value of the gradient Gp11, and the time integral value of the latter half is equal to the time integral value of the gradient Gp13. The same is true for the gradients Gp21, Gp22 and Gp23. The time integral value will be referred to simply as the integral value hereinbelow.

The gradients Gp11, Gp12 and Gp13 generate a spin echo SE1, as shown at (5). The spin echo SE1 focalizes at a point where the rephasing by the gradient Gp12 equilibrates with the preceding dephasing, and has a maximum amplitude value, or a peak, at this time point.

Although the peak of the spin echo SE1 should occur at a time point where the integral value of the gradient Gp12 equals that of the gradient Gp11, that is, should occur after a time period TE from the 90° excitation, when residual magnetization Gp0 exists in the phase axis direction, an error $\Delta t1$ occurs at the time of the peak appearance of the spin echo SE1 due to dephasing by the gradient Gp0 during the time period between the 90° and 180° excitations. A similar effect is experienced when eddy current is generated. The following description will be made in terms of the residual magnetization.

The error $\Delta t1$ is positive when the direction of dephasing by the residual magnetization Gp0 is the same as that by the gradient Gp11, and is negative when the directions are opposite. While the following description will be made on a case of the positive error, when the error is negative, the same holds except that positive and negative are interchanged.

The gradients Gp21, Gp22 and Gp23 generate a spin echo SE2. The spin echo SE2 focalizes at a point where the rephasing by the gradient Gp22 equilibrates with the preceding dephasing. That is, it focalizes at a time point where the integral value of the gradients Gp21 and Gp22 is equal to that of the gradients Gp12 and Gp13 after the peak generation of the spin echo SE1. Thus, the spin echo SE2 has its peak at a time point different from its proper focalization time point by $-\Delta t2$.

Data concerning the spin echoes SE1 and SE2 are collected by the data collecting section 150. A portion consisting of the magnet system 100, gradient driving section 130 and data collecting section 150 involved in the generation of the spin echoes SE1 and SE2 and the data collection concerning them is an embodiment of the echo readout means of the present invention.

The difference between the errors $+\Delta t1$ and $-\Delta t2$ represents a phase error of spins due to the residual magnetization Gp0 during the time period between the 90° and 180° excitations. The phase error is proportional to the integral value of the residual magnetization Gp0 during that time period.

Since no gradient except the residual magnetization Gp0 exists in the phase axis direction from the 90° excitation to the 180° excitation in this pulse sequence, the difference between $+\Delta t1$ and $-\Delta t2$ accurately represents the phase error due to the residual magnetization Gp0.

The data concerning the spin echoes SE1 and SE2 are input to the data processing section 170. The data processing section 170 performs a calculation using the input data to determine a measured value of the phase error.

A conceptional diagram of the phase error calculation by the data processing section 170 is shown in FIG. 4. The data of the spin echo SE1 has a peak position displaced by $+\Delta t1$ from the origin on the time axis t, as shown by the left graph of graphs (1) in FIG. 4.

When such echo data is Fourier transformed, a data sequence of complex numbers is obtained. The complex data sequence has a linear phase profile symmetrical with respect to the origin, as shown by the right graph. It should be noted that an assumption is made that in the phase profile at $\Delta t=0$, all phases are zero. The same assumption is made in the following description.

The slope of the phase profile represents the peak position shift $+\Delta t1$ of the spin echo SE1. The magnitude of the slope is proportional to the shift amount $\Delta t1$ of the peak position. The sign of the slope is positive, in agreement with the sign of the peak position shift.

The data of the spin echo SE2 has a peak position displaced by $-\Delta t2$ from the origin on the time axis t, as shown by the left graph of graphs (2) in FIG. 4. When such echo data is Fourier transformed, the phase profile becomes a linear profile symmetrical with respect to the origin, as shown by the right graph.

The slope of the phase profile is proportional to the shift amount $\Delta t2$ of the peak position. The sign of the slope is negative, in agreement with the sign of the peak position shift.

By determining the difference between these phase profiles, a phase difference profile is obtained as shown at (3). The phase difference profile represents the difference of the peak position shifts of the two spin echoes, that is, a phase error of spins due to the residual magnetization Gp0 during the time period between the 90° and 180° excitations. The phase difference profile represents the magnitude of the phase error by the magnitude of its slope, and the sign of the phase error by the sign of its slope.

The calculation of the phase difference profile as described above is performed at the data processing section 170. The data processing section 170 is an embodiment of the phase error calculating means of the present invention.

If concomitant residual magnetization is generated by applying the gradients Gp11, Gp12, Gp13, Gp21, Gp22 and Gp23, the measured value of the phase error may contain an error due to the effect of the concomitant residual magnetization.

Figure 5:
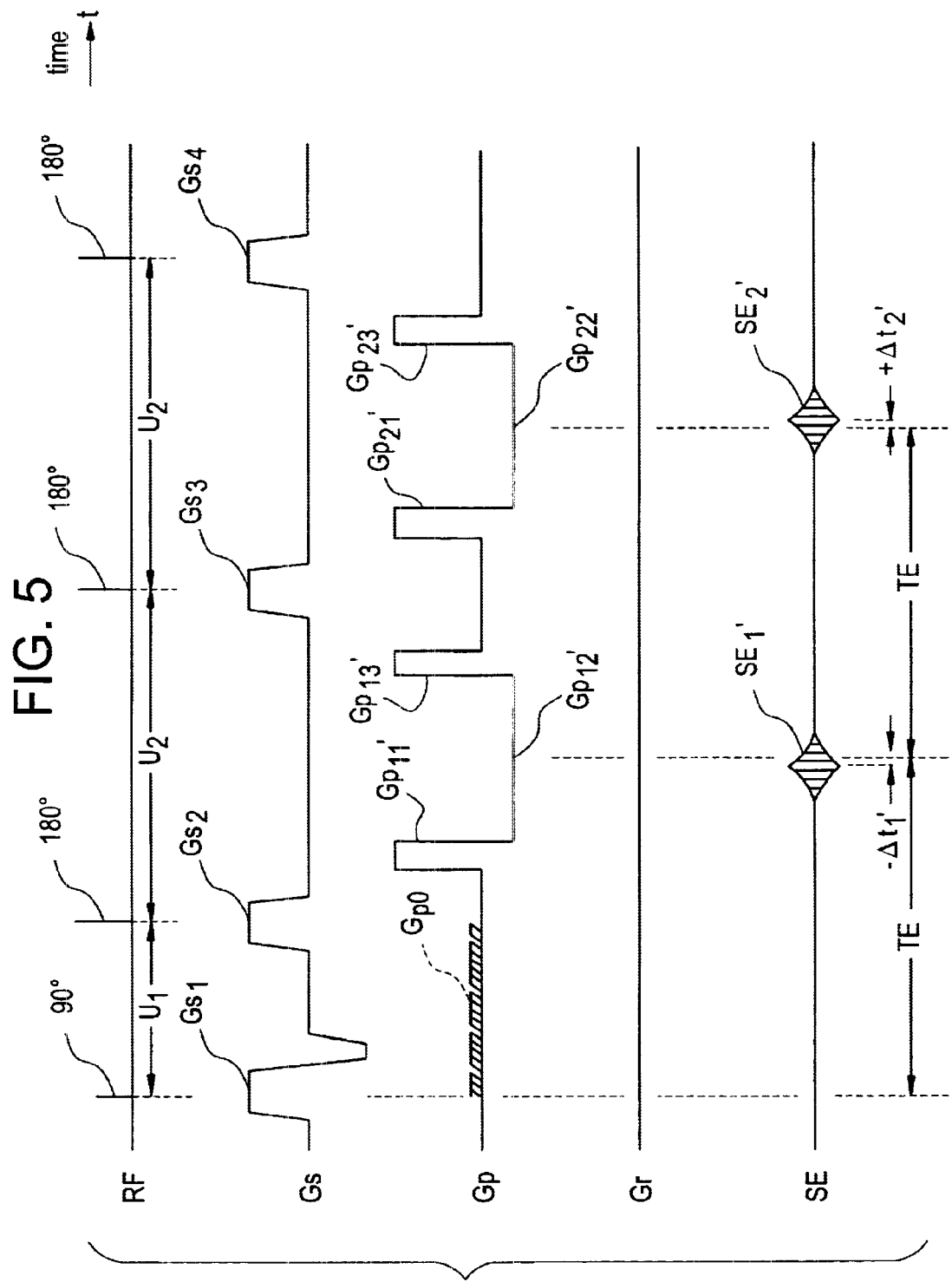
FIG. 5 is a diagram illustrating an exemplary pulse sequence for phase error measurement.

As measures for addressing such a situation, sequences as exemplarily shown in FIG. 5 are used to collect spin echoes SE1' and SE2', in which the polarity of the gradients Gp11, Gp12, Gp13, Gp21, Gp22 and Gp23 are all inverted.

Gradients Gp11', Gp12', Gp13', Gp21', Gp22' and Gp23' in FIG. 4 have polarity opposite to those of the gradients Gp11, Gp12, Gp13, Gp21, Gp22 and Gp23 in FIG. 3. Conditions other than the polarity are the same between the gradients of FIG. 3 and FIG. 5.

By determining a phase error based on the difference between errors −Δt1' and +Δt2' of the focalization timing of such spin echoes SE1' and SE2', a measured value can be obtained in which the effect of the concomitant residual magnetization by the gradients Gp11, Gp12, Gp13, Gp21, Gp22 and Gp23 is inverted.

FIG. 6 shows a conceptional diagram of the phase error calculation based on the spin echoes SE1' and SE2'. Data of the spin echo SE1' has a peak position displaced by −Δt1' from the origin on the time axis t, as shown by the left graph of (1) in FIG. 6.

A phase profile of a complex data sequence obtained by Fourier transforming the echo data is such as shown by the right graph. The slope of the phase profile is proportional to the shift amount Δt1' of the peak position. The sign of the slope is negative, corresponding to the direction of the peak position shift.

Data of the spin echo SE2' has a peak position displaced by +Δt2' from the origin on the time axis t, as shown by the left graph of graphs (2). A phase profile obtained by Fourier transforming the echo data is such as shown by the right graph. The slope of the phase profile is proportional to the shift amount Δt2' of the peak position. The sign of the slope is positive, corresponding to the direction of the peak position shift.

By determining the difference between these phase profiles, a phase difference profile is obtained as shown at (3). It should be noted that the phase difference profile is obtained by a subtraction operation of (2)−(1), because the polarity of the gradients Gp11', Gp12', Gp13', Gp21', Gp22' and Gp23' has been inverted.

The phase difference profile also represents a phase error of spins due to the residual magnetization Gp0 during the time period between the 90° and 180° excitations. However, the effect of the residual magnetization concomitant to the gradients Gp11, Gp12, Gp13, Gp21, Gp22 and Gp23 is inverted.

The execution of the pulse sequence shown in FIG. 3 and the phase error calculation based on the two spin echoes SE1 and SE2, and the execution of the pulse sequence shown in FIG. 5 and the phase error calculation based on the two spin echoes SE1' and SE2' are sequentially performed under control of the control section 160. The control section 160 is an embodiment of the control means of the present invention.

By averaging the phase difference profile of (3) in FIG. 4 and that of (3) in FIG. 6, the error due to the effect of the concomitant residual magnetization can be canceled, whereby a phase difference profile, or a phase error measured value, can be obtained with good accuracy.

The averaging of the two phase difference profiles is performed by the data processing section 170. The data processing section 170 is an embodiment of the average calculating means of the present invention.

An FID (free induction decay) signal generated accompanying the first 180° excitation is mingled into the spin echo SE1 as noise, thereby adversely affecting the accuracy of the phase error measurement.

Figure 7:
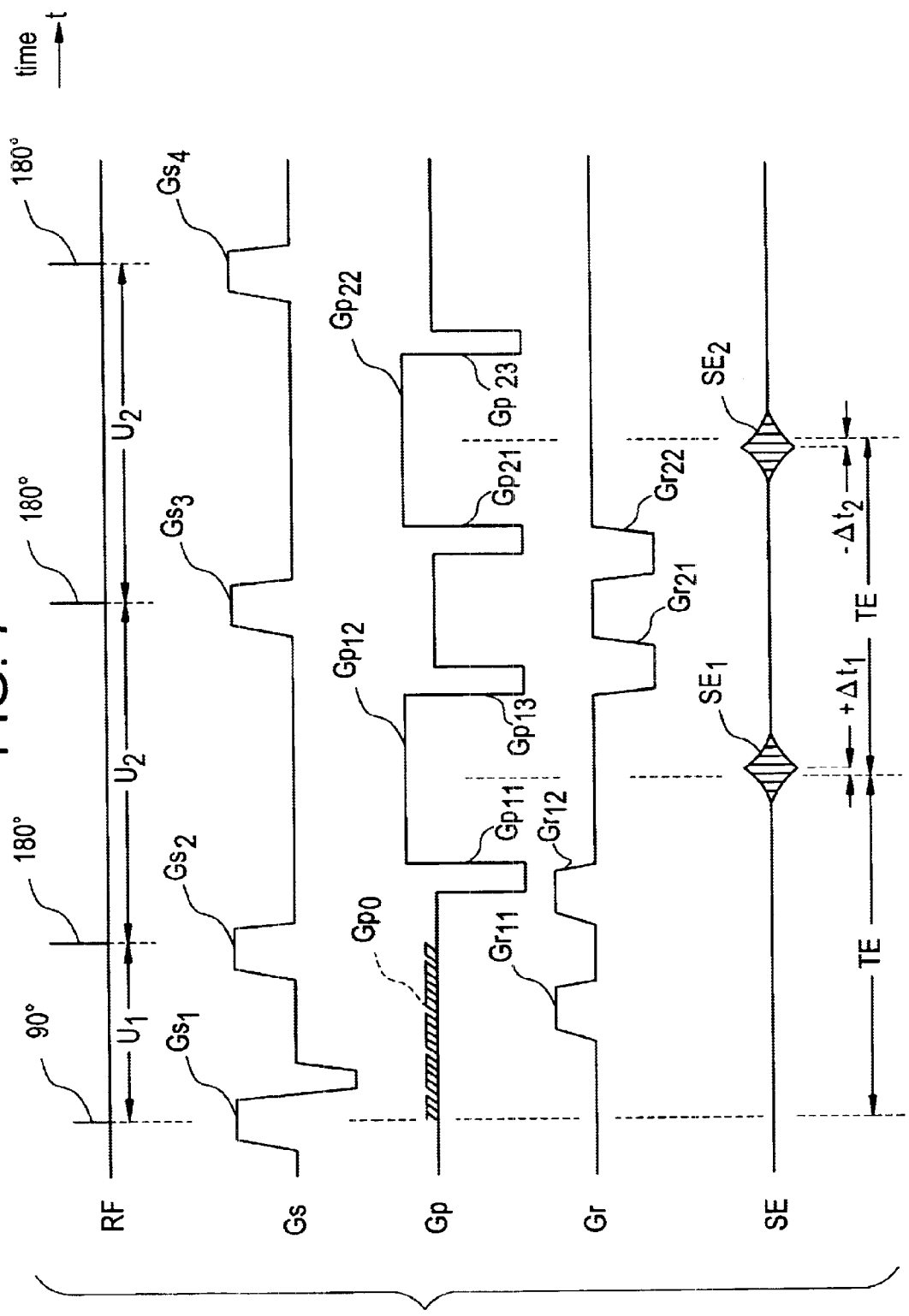
FIG. 7 is a diagram illustrating an exemplary pulse sequence for phase error measurement.

Accordingly, in order to remove the FID-based noise, gradients Gr11 and Gr12 are applied in the frequency axis direction before and after the first 180° excitation, respectively, and gradients Gr21 and Gr22 are applied before and after the second 180° excitation, respectively, as exemplarily shown at (4) in FIG. 7.

The gradient Gr12 applied after the first 180° excitation is a so-called crusher, which disperses the phase of excited spins to make the signal intensity of the FID signal zero, avoiding the noise with respect to the spin echo SE1.

The gradient Gr11 applied before the first 180° excitation is a gradient for dispersing the phase of the spins in advance so that the spin echo SE1 is prevented from being affected by the crusher. The phase dispersed by the gradient Gr11 is rephased by the gradient Gr12 applied after the 180° excitation and returns to the proper state.

The gradient Gr22 applied after the second 180° excitation is also a crusher, which disperses the phase of excited spins to make the signal intensity of the FID signal zero, avoiding the noise with respect to the spin echo SE2.

The gradient G21 applied before the second 180° excitation is a gradient for dispersing the phase of the spins in advance so that the spin echo SE2 is prevented from being affected by the crusher. The phase dispersed by the gradient Gr21 is rephased by the gradient Gr22 applied after the 180° excitation and returns to the proper state.

The gradient Gr22 applied after the second 180° excitation is also a crusher for a stimulated echo. Spins that generate the stimulated echo exist as longitudinal magnetization from the first 180° excitation to the second 180° excitation, and they are not affected by the gradient magnetic fields during this time period.

The longitudinal magnetization is turned into transverse magnetization by the second 180° excitation and becomes a source of stimulated echo generation. By dispersing the phase by the crusher Gr22, focalization of the echo is inhibited, thereby avoiding stimulated echo generation. Thus, a stimulated echo is prevented from being mingled into the spin echo SE2 to interfere with the phase error measurement.

A portion consisting of the magnet system 100 and gradient driving section 130 involved in the application of the gradients Gr11, Gr12, Gr21 and Gr22 is an embodiment of the crusher gradient magnetic field applying means of the present invention.

If concomitant residual magnetization is generated by applying the gradients Gr11, Gr12, Gr21 and Gr22, the measured value of the phase error may contain an error due to the effect of the concomitant residual magnetization.

Figure 8:
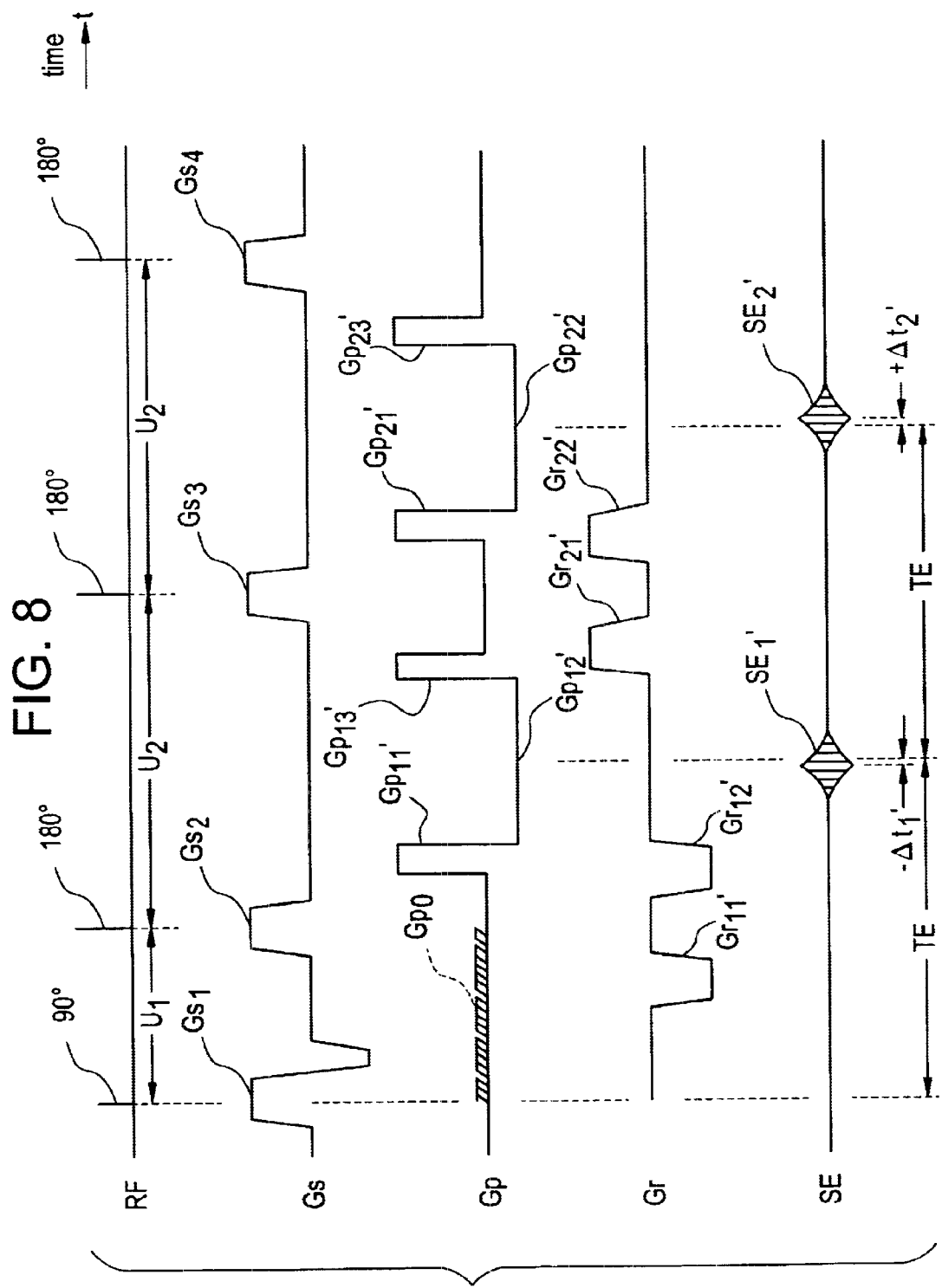
FIG. 8 is a diagram illustrating an exemplary pulse sequence for phase error measurement.

As measures for addressing such a situation, sequences as exemplarily shown in FIG. 8 are used to collect spin echoes SE1' and SE2', in which the polarity of the gradients Gp11, Gp12, Gp13, Gp21, Gp22 and Gp23, and the polarity of the gradients Gr11, Gr12, Gr21 and Gr22 are all inverted.

Gradients Gp11', Gp12', Gp13', Gp21', Gp22'and Gp23' and gradients Gr11', Gr12', Gr21'and Gr22' in FIG. 7 have polarity opposite to those of the gradients Gp11, Gp12, Gp13, Gp21, Gp22 and Gp23 and the gradients Gr11, Gr12, Gr21 and Gr22 in FIG. 6. Conditions other than the polarity are the same between the gradients of FIG. 7 and FIG. 8.

By determining a phase error based on the difference between errors −Δt1' and +Δt2' of the focalization timing of such spin echoes SE1' and SE2', a measured value can be obtained in which the effect of the concomitant residual magnetization by the gradients Gp11, Gp12, Gp13, Gp21, Gp22 and Gp23 and the gradients Gr11, Gr12, Gr21 and Gr22 is inverted.

Thus, by averaging the phase error, or the phase difference profile, obtained from the spin echoes SE1 and SE2 in FIG.

7 and that obtained from the spin echoes SE1' and SE2' in FIG. 7, a phase error measured value not affected by the concomitant residual magnetization due to the gradients Gp11, Gp12, Gp13, Gp21, Gp22 and Gp23 and the gradients Gr11, Gr12, Gr21 and Gr22 can be obtained.

Based on the phase error thus obtained, correction of the phase error is performed. Since the phase error is generated by the dephasing by the residual magnetization Gp0 during the period between the 90° and 180° excitations, a gradient having an integral value equal to the integral value of the residual magnetization Gp0 in that time period may be applied inversely.

Since the relationship between the integral value of a gradient and the amount of dephasing is theoretically determined, the integral value of the gradient for the phase error correction can be obtained based on the phase error measured value via a calculation.

In performing magnetic resonance imaging by the FSE technique, a scan is performed by a pulse sequence with a gradient having such an integral value appended in the phase axis direction. An example of such a pulse sequence is shown in FIG. 8.

Figure 9:
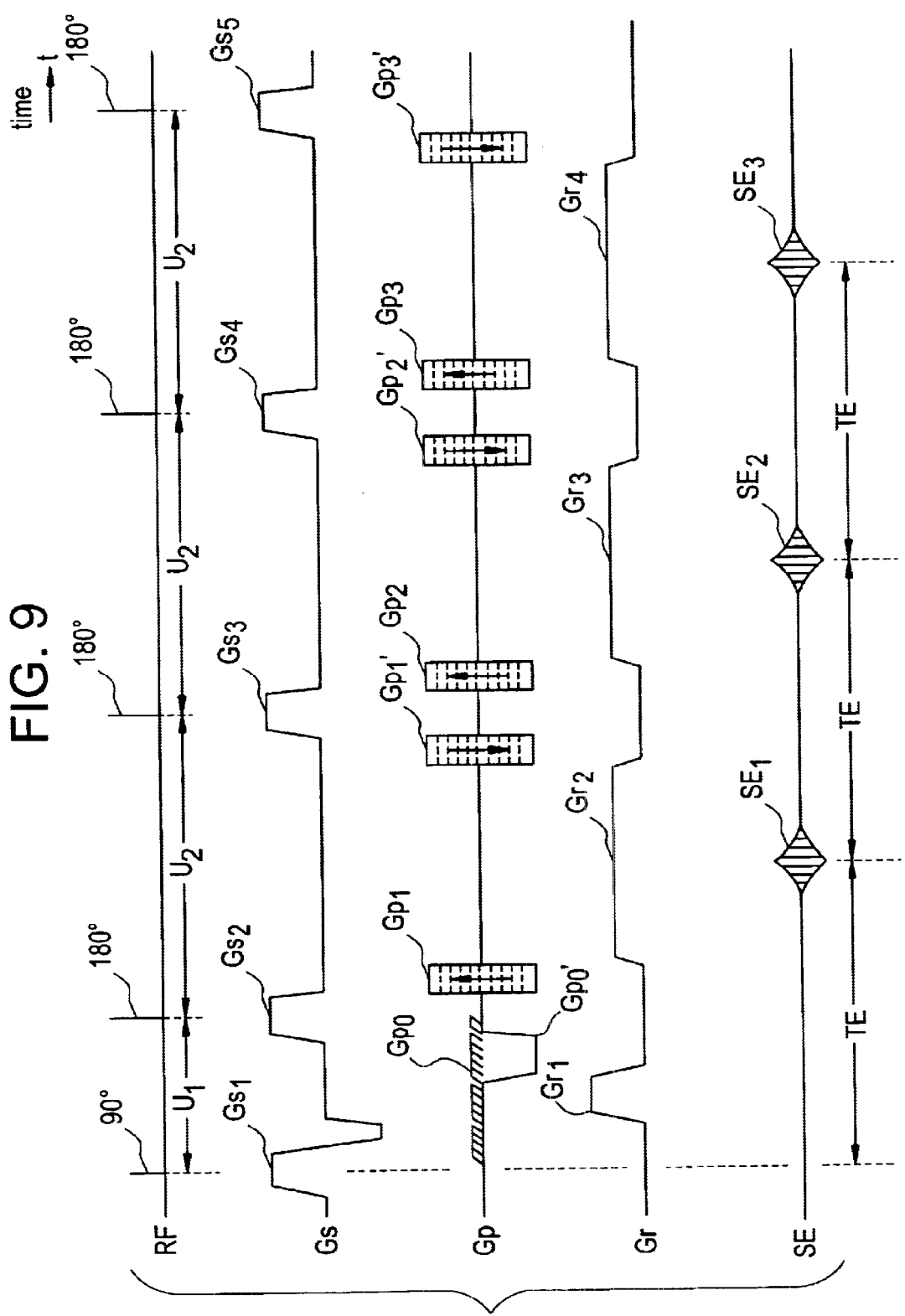
FIG. 9 is a diagram illustrating an exemplary pulse sequence for magnetic resonance imaging.

As shown at (3) in FIG. 9, a gradient Gp0' is applied in the phase axis direction during a time period between 90° and 180° excitations. The integral value of the gradient Gp0' is equal to that of the residual magnetization Gp0 in that period and has opposite polarity. This makes dephasing in that period zero, thereby eliminating the phase error. A portion consisting of the magnet system 100 and gradient driving section 130 involved in the application of the gradient Gp0' is an embodiment of the corrective gradient magnetic field applying means of the present invention.

This pulse sequence is the same as that of the ordinary FSE technique shown in FIG. 1, except for the gradient Gp0'. By this pulse sequence, spin echo data are collected for, for example, 16 views for one 90° excitation. By repeating the collection 32 times, for example, spin echo data are obtained for 512 views. An image is reconstructed by two-dimensional Fourier transforming the spin echo data.

Because no phase error exists, the peaks of all the spin echoes occur at proper timing. Therefore, a reconstructed image not containing artifacts due to phase error can be obtained with high quality.

The measurement and correction of the phase error is preferably done every time before performing imaging by the FSE technique. This enables scans to be always adapted to the most recent state even if the state of residual magnetization is changed by the preceding scan, thereby allowing a reconstructed image to be always obtained with high quality.

It should be noted that the phase error measurement and correction as described above can be combined not only with imaging that employs the FSE technique but also with imaging that employs a pulse sequence derived from the FSE technique, such as IR-FSE (inversion recovery FSE) and fast FLAIR (fast fluid attenuated inversion recovery) techniques.

A program for operating a computer to perform the phase error measuring function as described above is recorded on a recording medium in a computer-readable manner. For the recording medium, there can be used, for example, any one of a magnetic recording medium, an optical recording medium and a magneto-optical recording medium, or any other appropriate type of recording medium. The recording medium may be a semiconductor storage medium. A storage medium is synonymous with a recording medium in the present specification.

Moreover, a program for operating a computer to perform the phase error correcting function as described above is recorded on a recording medium in a computer-readable manner. For the recording medium, there can be used, for example, any one of a magnetic recording medium, an optical recording medium and a magneto-optical recording medium, or any other appropriate type of recording medium. The recording medium may be a semiconductor storage medium. A storage medium is synonymous with a recording medium in the present specification.

Many widely different embodiments of the invention may be configured without departing from the spirit and the scope of the present invention. It should be understood that the present invention is not limited to the specific embodiments described in the specification, except as defined in the appended claims.

What is claimed is:

1. A phase error measuring method comprising the steps of:

effecting a 90° excitation on object spins;

effecting a first 180° excitation after a first time period from said 90° excitation;

effecting a second 180° excitation after a second time period from said first 180° excitation;

effecting a third 180° excitation after said second time period from said second 180° excitation;

applying a first gradient magnetic field consisting of a first pulse of a first polarity, followed immediately by a second pulse of a second polarity, opposite to said first polarity followed immediately by a third pulse of said first polarity and having a time integral value of zero in a phase axis direction during the time period from said first 180° excitation to said second 180° excitation to generate a first spin echo signal with a first phase error determined by distance from a peak of said first spin echo and a point in time when the time integral of said first pulse and said second pulse are equal;

applying a second gradient magnetic field consisting of a first pulse of a first polarity followed immediately by second pulse of a second polarity which is opposite to said polarity followed immediately by a third pulse of said polarity and having a time integral value of zero in the phase axis direction during the time period from said second 180° excitation to said third 180° excitation to generate a second spin echo signal with a second phase error determined by distance from a peak of said second spin echo and a point in time when the time integral of said first pulse and second pulse are equal; and determining a phase error of the spins in the phase axis direction due to residue magnetization or eddy current or combination thereof during the time period from said 90° excitation to said first 180° excitation based on calculation using said first phase error and said second phase error of said first and second spin echo signals.

2. The method of claim 1, further comprising the step of: applying crusher gradient magnetic fields in a frequency axis direction before and after each of said 180° excitations.

3. The method of claim 1, further comprising the steps of:
repeating the foregoing steps twice on trial with polarity of said gradient magnetic fields inverted; and
determining average of the former and latter determined phase errors.

4. The method of claim 3, further comprising the step of: applying crusher gradient magnetic fields in a frequency axis direction before and after each of said 180° excitations.

5. The method of claim 4, further comprising the step of: applying said crusher gradient magnetic fields in two trials with their polarity inverted.

6. The method of claim 3, further comprising the step of: applying a gradient magnetic field that makes average of said phase errors zero in a phase axis direction during a time period from a 90° excitation to a 180° excitation.

7. The method of claim 6, further comprising the step of: applying crusher gradient magnetic fields in a frequency axis direction before and after each of said 180° excitations.

8. The method of claim 7, further comprising the step of: applying said crusher gradient magnetic fields in said two trials with their polarity inverted.

9. The method of claim 1, further comprising the step of: applying a gradient magnetic field that makes said phase error zero in the phase axis direction during a time period from a 90° excitation to a 180° excitation.

10. The method of claim 9, further comprising the step of: applying crusher gradient magnetic fields in a frequency axis direction before and after each of said 180° excitations.

11. A phase error measuring apparatus comprising:
first means for effecting a 90° excitation on object spins, for effecting a first 180° excitation after a first time period from said 90° excitation, for effecting a second 180° excitation after a second time period from said first 180° excitation, and for effecting a third 180° excitation after said second time period from said second 180° excitation;
second means for applying a first gradient magnetic field consisting of a first pulse of a first polarity, followed immediately by a second pulse of a second polarity opposite to said first polarity, followed immediately by a third pulse of said first polarity and having a time integral value of zero in a phase axis direction during time period from said first 180° excitation to said second 180° excitation to generate a first spin echo signal with a first phase error determined by distance from a peak of said first echo signal and a point in time when the time integral of said first pulse and said second pulse are equal, and for applying a second gradient magnetic field consisting of a first pulse of a first polarity followed immediately by a second pulse of a second polarity which is opposite to said first polarity followed immediately by a third pulse of said first polarity and having a time integral value of zero in the phase axis direction during the time period from said second 180° excitation to said third 180° excitation to generate a second spin echo signal with a second phase error determined by a distance from a peak of said second spin echo and a point in time when the time integral of said first pulse and second pulse are equal; and
third means for determining a phase error of the spins in the phase axis direction due to residual magnetization or eddy current or combination thereof during the time period from said 90° excitation to said first 180° excitation based on calculation using said first phase error and said second phase error of said first and second spin echo signals.

12. The apparatus of claim 11, further comprising: fourth means for applying crusher gradient magnetic fields in a frequency axis direction before and after each of said 180° excitations.

13. The apparatus of claim 11, further comprising:
fifth means for repeating spin excitations by said first means, the spin echo readout by said second means, and phase error calculation by said third means twice on trial with polarity of said gradient magnetic fields being inverted; and
sixth means for determining average of the former and latter determined phase errors.

14. The apparatus of claim 13, further comprising: fourth means for applying crusher gradient magnetic fields in a frequency axis direction before and after each of said 180° excitations.

15. The apparatus of claim 14, wherein said fifth means causes said fourth means to apply said crusher gradient magnetic fields in said two trials with their polarity inverted.

16. The apparatus of claim 13, further comprising: seventh means for applying a gradient magnetic field that makes average of said phase errors zero in the phase axis direction during a time period of from a 90° excitation to a 180° excitation.

17. The apparatus of claim 16, further comprising: fourth means for applying crusher gradient magnetic fields in a frequency axis direction before and after each of said 180° excitations.

18. The apparatus of claim 17, wherein said fifth means causes said fourth means to apply said crusher gradient magnetic fields in said two trials with their polarity inverted.

19. The apparatus of claim 11, further comprising: sixth means for applying a gradient magnetic field that makes said phase error zero in the phase axis direction during a time period from a 90° excitation to a 180° excitation.

20. The apparatus of claim 19, further comprising: fourth means for applying crusher gradient magnetic fields in a frequency axis direction before and after each of said 180° excitations.

21. A recording medium wherein being recorded in a computer readable manner with a program for causing a computer to execute the functions of:
effecting a 90° excitation on object spins;
effecting a first 180° excitation after a first time period from said 90° excitation;
effecting a second 180° excitation after a second time period from said first 180° excitation;
effecting a third 180° excitation after said second time period from said second 180° excitation;
applying a first gradient magnetic field consisting of a first pulse of a second polarity followed immediately by a second pulse of a second polarity opposite to said first polarity, followed immediately by a third pulse of said first polarity and having a time integral value of zero in a phase axis direction during the time period from said first 180° excitation to said second 180° excitation to generate a first spin echo signal with a first phase error determined by distance from a peak of said first spin echo and a point in time when the time integral of said first pulse and said second pulse are equal;
applying a second gradient magnetic field consisting of a first pulse of first polarity followed immediately by a second pulse of first polarity which is opposite to said polarity followed immediately by a third pulse of said selected first polarity and having a time integral value of zero in the phase axis direction during the time period from said second 180° excitation to said third 180° excitation to generate a second spin echo signal with a second phase error determined by distance from a peak of said second spin echo and a point in time when the time integral of said first pulse and second pulse are equal and
determining a phase error of the spins in the phase axis direction due to residue magnetization or eddy current or combination thereof during the time period from said 90° excitation to said first 180° excitation based on calculation using said first phase error and said second phase error of said first and second spin echo signals.

22. The medium of claim 21, further executing the functions of: repeating said steps twice on trial with polarity of said gradient magnetic fields inverted; and determining average of the former and the latter determined phase errors.

23. The medium of claim 22, further executing the functions of: applying a gradient magnetic field that makes average of said phase errors zero in the phase axis direction during a time period from a 90° excitation to a 180° excitation.

24. The medium of claim 1, further executing the functions of: applying a gradient magnetic field that makes said phase error zero in the phase axis direction during a time period from a 90° excitation to a 180° excitation.

25. A magnetic resonance imaging apparatus acquiring a magnetic resonance signal from a object using a static magnetic field, gradient magnetic fields, and a high frequency magnetic field, and constructing an image based on said acquired magnetic resonance signal, said apparatus comprising:

first means for effecting a 90° excitation on object spins, for effecting a first 180° excitation after a first time period from said 90° excitation, for effecting a second 180° excitation after a second time period from said first 180° excitation, and for effecting a third 180° excitation after said second time period from said second 180° excitation;

second means for applying a first gradient magnetic field consisting of a first pulse of first polarity, followed immediately by a second pulse of a second polarity opposite to said first polarity, followed immediately by a third pulse of said first polarity and having a time integral value of zero in a phase axis direction during time period from said first 180° excitation to said second 180° excitation to generate a first spin echo signal with a first phase error determined by distance from a peak of said first echo signal and a point in time when the time integral of said first pulse and said second pulse are equal, and for applying a second gradient magnetic field consisting of a first pulse of a first polarity followed immediately by a second pulse of a second polarity which is opposite to said first polarity followed immediately by a third pulse of said first polarity and having a time integral value of zero in the phase axis direction during the time period from said second 180° excitation to said third 180° excitation to generate a second spin echo signal with a second phase error determined by a distance from a peak of said second spin echo and a point in time when the time integral of said first pulse and said second pulse are equal; and third means for determining a phase error of the spins in the phase axis direction due to residual magnetization or eddy current or combination thereof during the time period from said 90° excitation to said first 180° excitation based on calculation using said first phase error and said second phase error of said first and second spin echo signals.

26. The apparatus of claim 25, further comprising: fourth means for applying crusher gradient magnetic fields in a frequency axis direction before and after each of said 180° excitations.

27. The apparatus of claim 25, further comprising:
fifth means for repeating spin excitations by said first means the spin echo readout by said second means and the phase error calculations by said third means twice on trial with polarity of said gradient magnetic fields inverted; and sixth means for determining average of the former and latter determined phase errors.

28. The apparatus of 27, further comprising: fourth means for applying crusher gradient magnetic fields in a frequency axis direction before and after each of said 180° excitations.

29. The apparatus of claim 28, wherein said fifth means causes said fourth means to apply said crusher gradient magnetic said two trials with thier polarity inverted.

30. The apparatus of claim 27, further comprising: sixth means for applying a gradient magnetic field that makes average of said phase errors zero in the phase axis direction during a time period from a 90° excitation to a 180° excitation.

31. The apparatus of claim 30, further comprising: fourth means for applying crusher gradient magnetic fields in a frequency a before and after each of said 180° excitations.

32. The apparatus of claim 31, wherein said fifth means causes said fourth means to apply said crusher gradient magnetic fields in said two trials with their polarity inverted.

33. The apparatus of claim 25, further comprising: sixth means for applying a gradient magnetic field that makes said phase error zero in the phase axis direction during a time period from a 90° excitation to a 180° excitation.

34. The apparatus of claim 33, further comprising: fourth means for applying crusher gradient magnetic fields in a frequency axis direction before and after each of said 180° excitations.

* * * * *